United States Patent
Micheloni et al.

(10) Patent No.: US 6,646,913 B2
(45) Date of Patent: Nov. 11, 2003

(54) METHOD FOR STORING AND READING DATA IN A MULTILEVEL NONVOLATILE MEMORY

(75) Inventors: Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/976,473

(22) Filed: Oct. 11, 2001

(65) Prior Publication Data

US 2002/0054505 A1 May 9, 2002

(30) Foreign Application Priority Data

Oct. 13, 2000 (EP) .............................. 00830671

(51) Int. Cl.[7] .............................................. G11C 16/04
(52) U.S. Cl. .............................. 365/185.03; 365/185.11
(58) Field of Search ................ 365/185.03, 185.11, 365/185.12, 185.14, 185.19, 185.13

(56) References Cited

U.S. PATENT DOCUMENTS

| | | | |
|---|---|---|---|
| 5,093,805 A | 3/1992 | Singh | 365/51 |
| 5,315,558 A | 5/1994 | Hag | 365/230.01 |
| 5,790,454 A * | 8/1998 | Choi | 365/185.03 |
| 5,835,414 A | 11/1998 | Hung et al. | 365/185.25 |
| 5,854,763 A | 12/1998 | Gillingham et al. | 365/189.04 |
| 5,953,255 A * | 9/1999 | Lee | 365/185.29 |
| 6,118,692 A | 9/2000 | Banks | 365/185.03 |
| 6,243,290 B1 * | 6/2001 | Kurata et al. | 365/185.03 |
| 6,373,767 B1 * | 4/2002 | Patti | 365/210 |

* cited by examiner

*Primary Examiner*—Anh Phung
(74) *Attorney, Agent, or Firm*—Lisa K. Jorgenson; Robert Iannucci; Seed IP Law Group PLLC

(57) ABSTRACT

The data management method applies to a multilevel non-volatile memory device having a memory array formed by a plurality of memory cells. Each of the memory cells stores a number of bits that is not an integer power of two, for example three. In this way, one data byte is stored in a non-integer number of memory cells. The managing method includes storing, in a same clock cycle, a data word formed by a plurality of bytes, by programming a preset number of adjacent memory cells. Reading is performed by reading, in a same clock cycle, the stored data word.

21 Claims, 5 Drawing Sheets

METHOD FOR STORING AND READING DATA IN A MULTILEVEL NONVOLATILE MEMORY

BACKGROUND OF THE INVENTION

1. Field of the Invention

The present invention regards a method for storing and reading data in a multilevel nonvolatile memory.

2. Description of the Related Art

As is known, in a memory that uses, as elementary cell, a MOS transistor having a floating gate region that can be biased through a control gate region, the possibility is exploited of modulating the threshold voltage of the cell to distinguish two logic states: one state in which the floating gate region does not contain any charge, characteristic of an erased cell (logic "1"), and another state in which the floating gate region stores a number of electrons sufficient for determining a sensible increase in the threshold voltage, thus identifying a programmed cell state (logic "0").

For reading the memory cell in a conventional two level memory, the control gate region is brought to a read voltage Vread, and the current flowing in the cell is read (FIG. 1a): if the cell is written, its threshold voltage is higher than the read voltage, and hence no current flows; if the cell is erased, its threshold voltage is higher than the read voltage, and the cell conducts current.

The information contained in the memory cell is read via a read circuit or "sense amplifier" which compares the current of the cell with a reference current and outputs the datum stored in a digital form.

Multilevel nonvolatile memories have recently appeared on the market, i.e., memories in which more than one bit per cell is stored. In this type of memories, the charge stored in the floating gate region is further broken up to generate a number of distributions corresponding to $2^n$, where n is the number of bits that are to be stored in each cell. For example, in case of two bits per cell, the read circuit has to work with four threshold voltage distributions (FIG. 1b), and no longer with two threshold voltage distributions (FIG. 1a) as in the case of two level memories. FIGS. 1a and 1b also show typical values of the threshold voltages.

Both in case of two level memories and in the case of multilevel memories, the distribution of the threshold voltages of the cells after electrical erasing is generally between about 1 V and 2.5 V. The lower limit of this distribution is given by the need to guarantee the absence of depleted cells (i.e., cells that conduct current even when a biasing voltage is not applied to their control gate region) and to prevent the thin oxide region beneath the floating gate region from being damaged during the write phase. The upper limit is instead due to the inherent amplitude of the distribution. In addition, the programmed level cannot be shifted above 6.5 V for reliability.

As may be clearly deduced from a comparison between FIG. 1a and FIG. 1b, multilevel programming entails a reduction in space between the distributions, and hence a reduction in the current differences that are to be detected in the read phase.

In particular, assuming a cell gain of 20 $\mu$A/V, in case of a two level memory there is a distance of 50 $\mu$A between the two distributions, whereas in case of a four level memory, there is a distance of 20 $\mu$A between the distributions, even though the higher distribution (corresponding to the bits "00") has been set at a higher voltage compared to the case of the two level memory.

The reduction in the distance between the currents flowing in the cells for the different threshold voltage values requires designing read circuits that are increasingly complicated, more sensitive to noise, etc.

Reasoning on a binary scale, to increase further the number of bits to be stored in a single cell, it is necessary to store four bits per cell, corresponding to sixteen threshold voltage distributions in the same overall threshold voltage interval. Assuming a distribution amplitude of 200 mV and a distance between the different threshold voltage levels of 100 mV, we are faced with current differences of 2 $\mu$A.

In addition, as the integration density increases (at present, 0.13 $\mu$m technologies are used) the cell gain tends to decrease. Consequently, with a gain of 10 $\mu$A/V, the distance between the currents corresponding to two adjacent levels drops as far as 1 $\mu$A; i.e., it decreases by a factor of twenty compared to the case of two bits per cell. The accuracy required for passing from two bits per cell to four bits per cell is consequently far greater than that required for passing from one bit per cell to two bits per cell.

BRIEF SUMMARY OF THE INVENTION

An embodiment of the present invention provides a storing method allowing an increase in storing capacity of a nonvolatile memory without this weighing too heavily on the requisites of reading accuracy, complexity and criticality.

The method is for a multilevel non-volatile memory device composed of a memory array of a plurality of memory cells, and includes storing in each memory cell a number of bits that is not an integer power of two.

BRIEF DESCRIPTION OF THE SEVERAL VIEWS OF THE DRAWING(S)

For an understanding of the present invention, preferred embodiments thereof are now described, purely to furnish non-limiting examples, with reference to the attached drawings, wherein.

Figure 4:
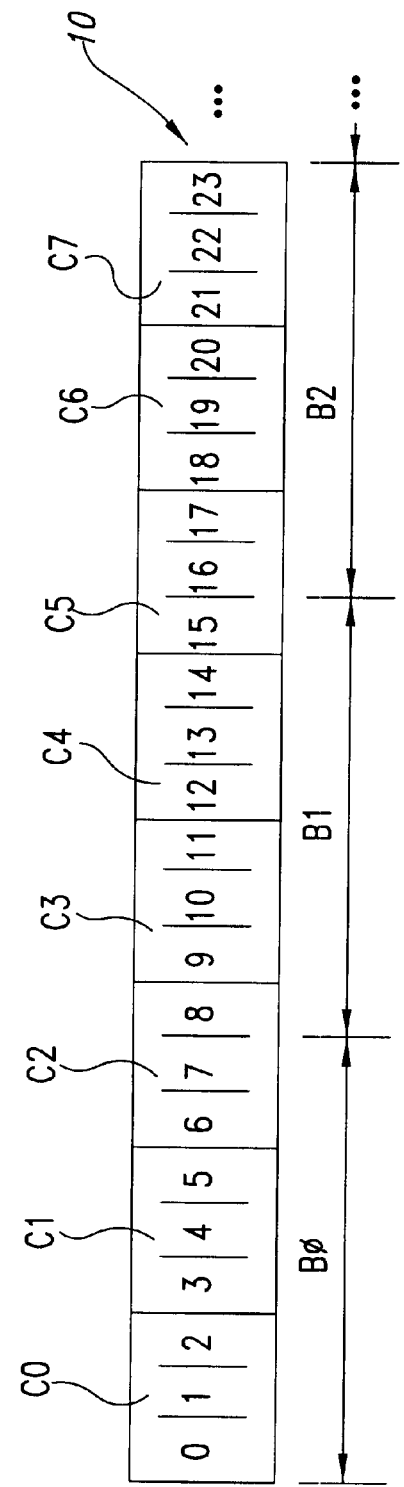
Figure 5:
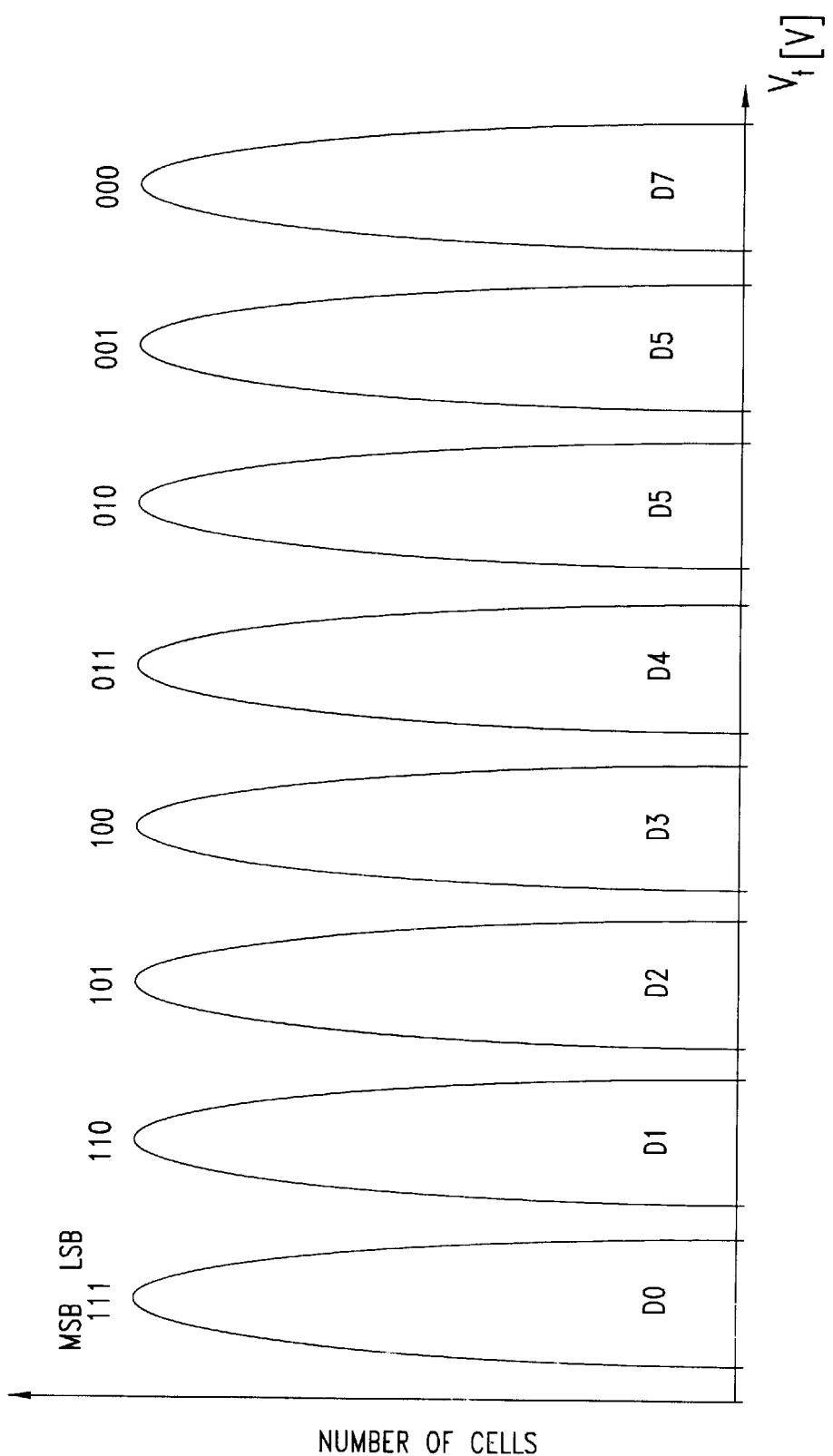
Figure 6:
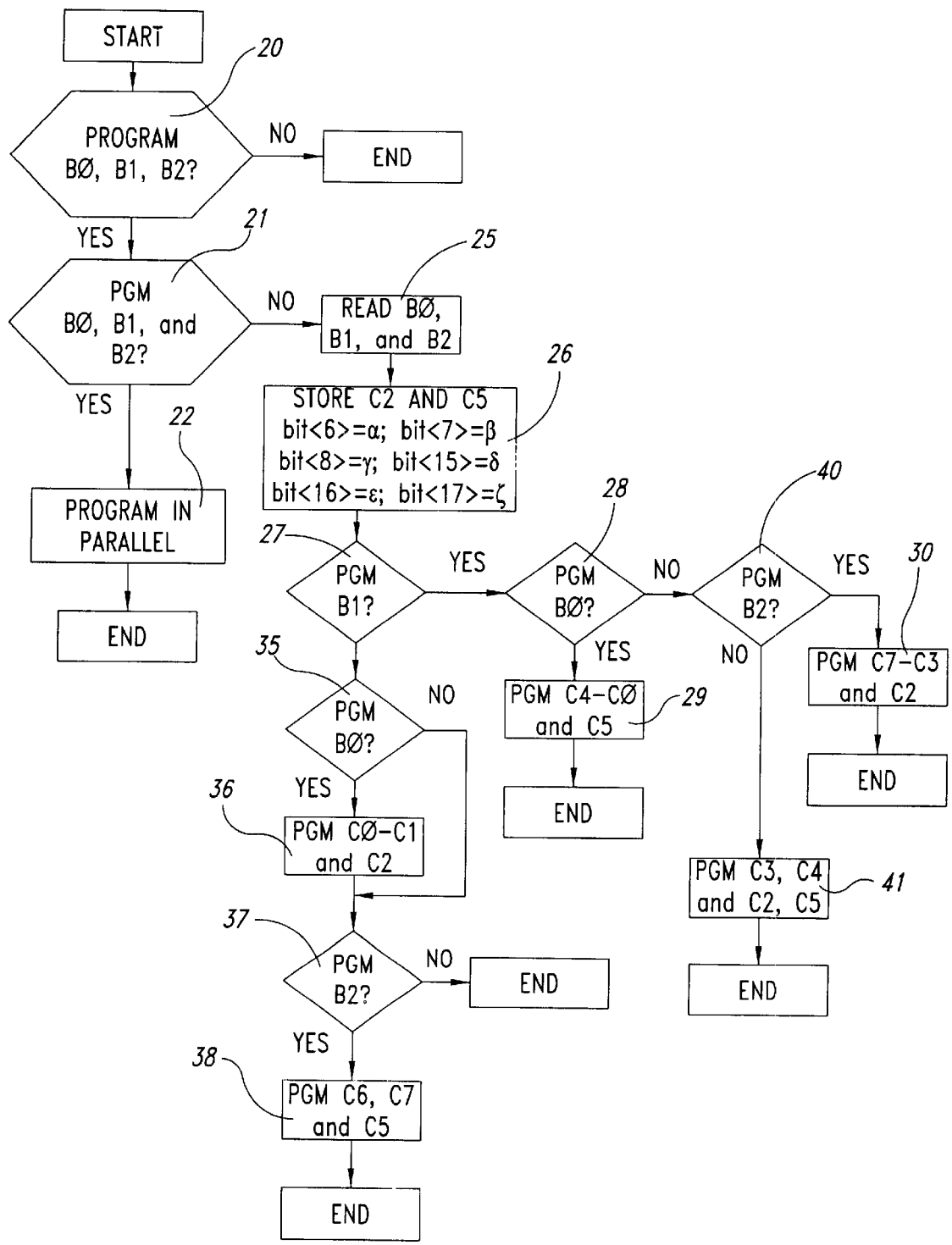

FIG. 4 presents a diagram of the distribution of bits in a multilevel memory for a second embodiment of the invention;

FIG. 5 shows the distribution of the threshold voltages in case of a multilevel memory with three bits per cell; and FIG. 6 shows a flowchart of the programming operations in the case of the distribution of bits illustrated in FIG. 4.

BRIEF DESCRIPTION OF THE SEVERAL VIEWS OF THE DRAWING(S)

According to an embodiment of the invention, in a multilevel memory each cell stores a number of bits that is not an integer power of two, for example three bits (corresponding to eight levels), which, according to the above, requires an increase of reading and writing precision much lower than that required for four bits (corresponding to sixteen different levels per cell). As used herein, the expression "non-binary power number of bits" refers to a number of bits that is not an integer power of two.

Storing of a non-binary power number of bits is opposed to the operation manner of conventional memories and the entire digital world. The very dimensions of the memory are currently defined in a binary way: speaking of a 1-Mbit memory means, in fact, speaking of 1024×1024 ($2^{20}$) bits.

The adoption of a non-binary power number of bits per cell thus involves the need to review the modes for managing (reading, programming) the bits stored in the cells. For example, if a single memory cell stores two bits, a 1-Mbit memory must contain 512 Kcells; in the case of four bits per cell, the memory is reduced to just 256 Kcells. In this latter case, the 256 Kcells form, in turn, a binary array that can be addressed with a purely binary decoding and can be divided into binary words (e.g., bytes, words, double words, etc.).

The use of three bits within a single cell modifies the existing situation since it causes the number of cells forming the array to be no longer binary. In practice, if it is necessary to design a device which works with words of eight bits, i.e., one byte, it is necessary to integrate three cells for each byte. This means that one bit every eight bits available in the array cannot be used. In fact, dividing eight bits by three bits per cell we obtain (8 bits)/(3 bits/cell)=2.67 cells corresponding to (3−2.67)/3=11% available cells not used.

To overcome the above problem, three solutions are described hereinafter. In the ensuing description, for clarity and simplicity, reference will be made to three bits per cell, but the same reasoning may be extended to the more general situation of a multilevel cell containing any non-binary power number of bits.

According to a first solution, the length of the words managed within the memory (hereinafter also referred to as "internal words") is chosen higher than 16 or 32 bits (normally used for communication with the outside world, for example with electronic devices incorporating the memory). In fact, dividing the number of bits of the binary word by 3, we obtain the number of cells necessary for storing of the word. Evidently, the number that is obtained from this division is not an integer and must be rounded off upwards. The excess bits are eliminated at the decoding level.

For example, in the case of 256 bit words we have (256 bits)/(3 bits/cell)=85.33 cells;

thus, implementing 86 cells, we thus obtain a percentage of unused cells equal to (86−85.33)/86=0.8%.

In the case of 512 bit words, we obtain a percentage of non-exploitation of 0.19%. In both cases, the waste of area due to non-exploitation of the cells becomes negligible if compared with the advantage deriving from storing three bits per cell.

In case of flash memories with NAND architecture, a word (i.e., number of cells arranged on same row) has 512 bytes; i.e., only two bits are not used every 4096 bits actually used, thus giving rise to a percentage of waste of 0.05%.

Figure 1A:
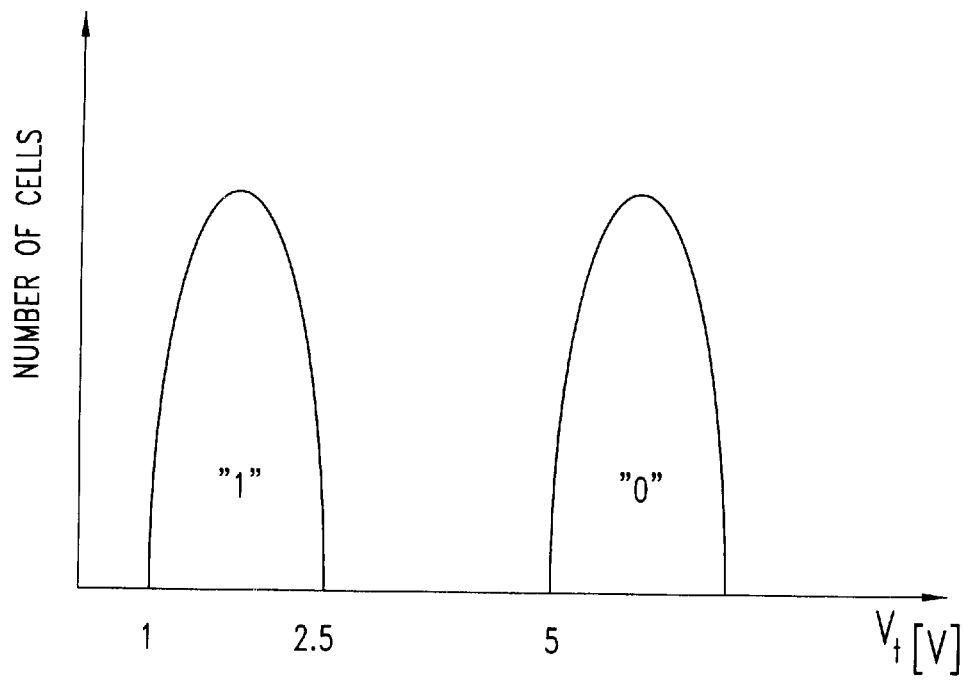
FIGS. 1a and 1b show the distributions of the threshold voltage for, respectively, a two level memory and a multilevel memory with two bits per cell.
Figure 1B:
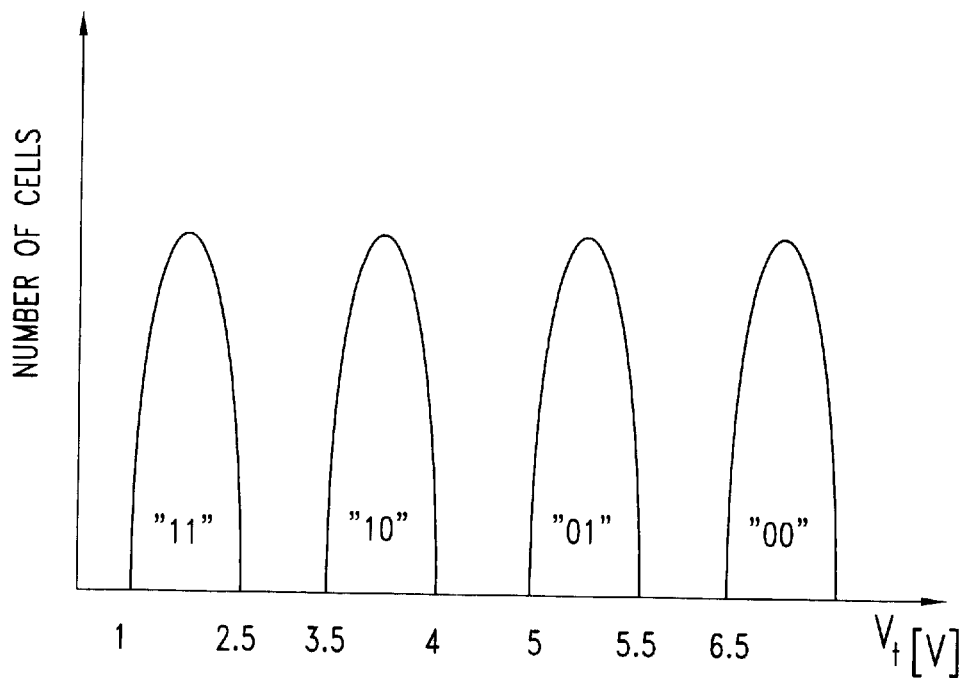
Figure 2:
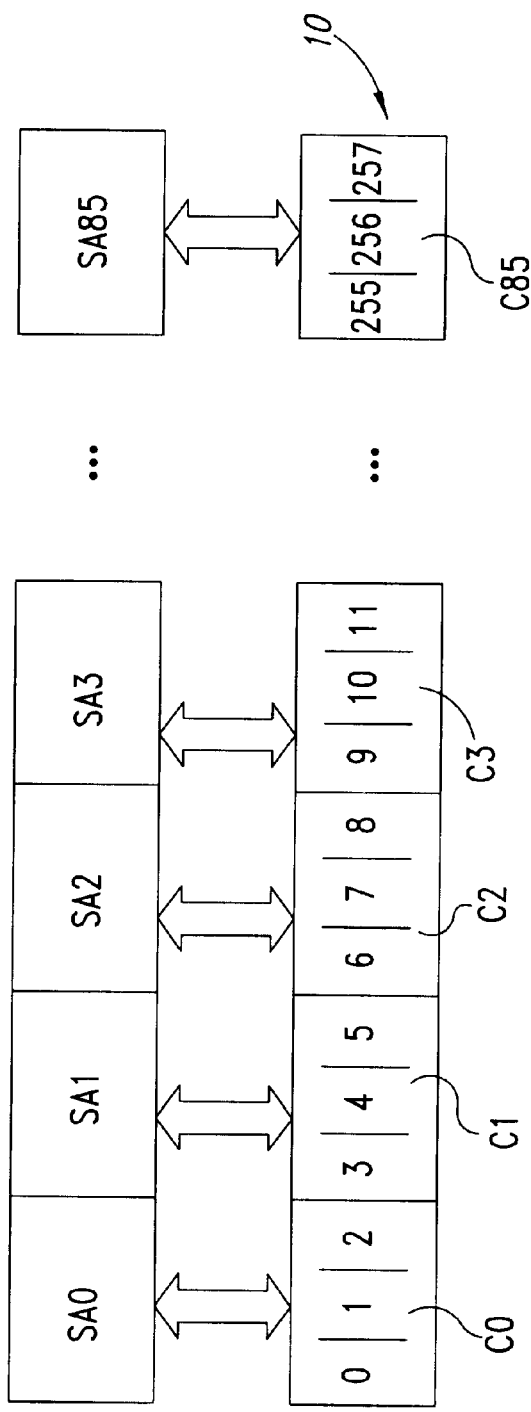
FIG. 2 shows a diagram of the distribution of the bits in a multilevel memory according to a first embodiment of the invention.

Hereinafter is described, as an example, the implementation of the first solution for 256 bit words. When three bits per cell are stored, a word may be stored in 86 memory cells, as shown in FIG. 2, in which the memory cells C0, C1, C2, . . . , C85 belonging to a memory array 10 respectively store the bits <0>–<2>, <3>–<5>, <6>–<8>, . . . , <255>–<257>. Of these bits, bits <0>–<255> form one word, and bits <256>, <257> have no meaning. A respective sense amplifier SA0, SA1, SA2, . . . , SA85 is connected to each cell C0, C1, C2, . . . , C85. The sense amplifiers thus outputs 258 bits. When reading the memory cells, the last two bits at the output of the sense amplifier SA85 are discarded (for example in a hardware way, by not connecting the two undesired outputs of the sense amplifier SA85) to obtain the stored binary word usable in a conventional way. Of course, the two bits to be discarded may be any ones whatsoever, at any point of the bit string at output from the sense amplifiers.

Figure 3:
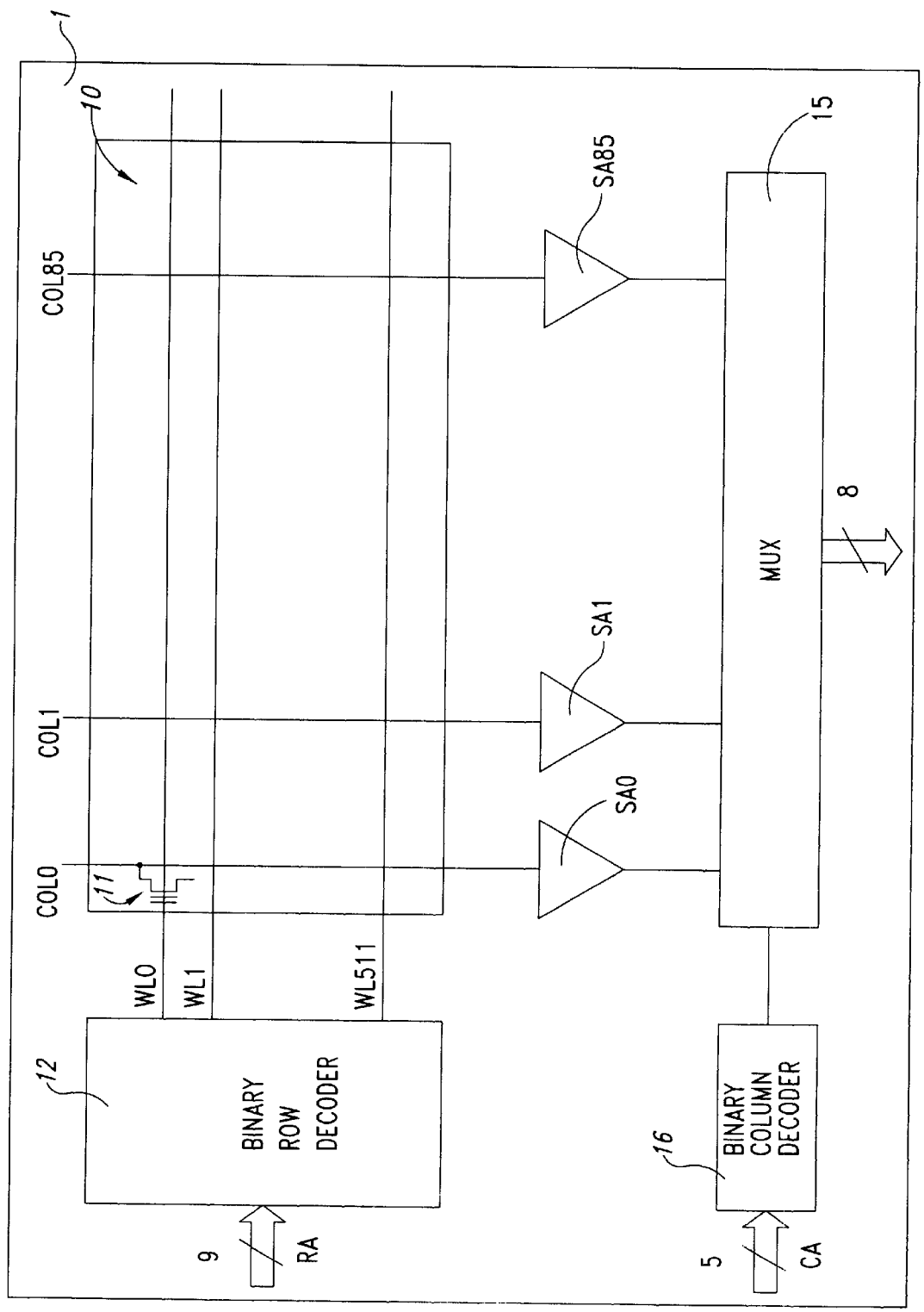
FIG. 3 shows a block diagram of the memory array implementing the diagram of FIG. 2.

FIG. 3 shows the architecture of a nonvolatile memory 1 comprising a memory array 10 formed by a plurality of memory cells 11 and addressed through a binary row decoder 12 receiving, from the outside, a 9 bit row address RA and each time addressing one of 512 word lines WL0, WL1, . . . , WL511. The memory array 10 in this case comprises 86 columns (COL0, COL1, . . . , COL85), each connected to a respective sense amplifier SA0, SA1, SA2, . . . , SA85. The outputs of the sense amplifiers SA0, SA1, SA2, . . . , SA85 are connected to a multiplexer 15 controlled by a binary column decoder 16 that receives, from the outside, a 5 bit column address CA. The multiplexer 15 outputs one byte.

As may be noted, the number of rows (word lines) is binary, and the rows are decoded in a standard way from the row address RA. The internal word comprises 256 bits, corresponding to 32 bytes ($2^5$ bytes). According to the column address CA, the binary column decoder 16 selects one of the 32 bytes supplied by the multiplexer 15 and is thus available to the outside.

Obviously, the memory array 10 may contain a number of columns that is an integer multiple of 86, corresponding to the number of 256 bit words to be read on a same word line.

Even though the architecture of FIG. 3 entails an increase in the number of sense amplifiers that must work in parallel, and hence an increase in the occupied area, consumption and noise, nonetheless, storing of a non-binary power number of bits per cell is even so advantageous, in particular in the cases described hereinafter.

At present, there is an increasing diffusion of a synchronous reading method, referred to as "burst reading", which improves data transfer between the memory and the device that uses it. With this reading method, data are supplied to the output of the memory synchronously with an external clock. The frequency of the clock is generally higher than that corresponding to the asynchronous access time. For example, the clock may have a frequency of 50 MHz (with a period T=20 ns), whilst the access time may be approximately 100 ns (corresponding to 10 MHz). Consequently, it is necessary to read, in the memory, an (internal) word longer than the (external) word supplied to the output, so as to have an external word available at each clock pulse.

Moreover, multilevel memory devices have the problem that the programming time is higher than for two level memories, because of the higher precision required for storing the different threshold voltages of the cells. To compensate for this situation, a high number of cells are programmed in parallel so as to obtain an effective programming time (per byte) which is reduced and comparable to that necessary for programming a two level cell.

In addition, error correction methods, or error correction codes (EECs), are currently employed that use parity bits. To contain the number of necessary parity bits, and hence the size of the array, the correction must be made on very long words.

Using an error correction with parity bits, the entire word on which the correction is made must be written in parallel with the parity bits. In nonvolatile memories, it is generally allowed to write a bit with logic value "0" where a bit with logic value "1" was present, but not the reverse. By convention, in fact, the logic value "1" derives from the cumulative operation performed on the entire memory array or on one preset part of the latter. In the case of flash memories, for example, the cells of entire sectors of the memory are erased, and the cells can only be written selectively. This means that modifying a logic "0" into a logic "1" of a given memory cell is equivalent to erasing the entire sector containing the memory cell. Altering even a single bit of a datum word may require writing a logic "1" over a "0" among the parity bits. Consequently, when the error correction method is used with parity bits, it is not allowed to alter a part of a datum smaller than that on which the parity is calculated.

Multilevel memories with error correction using parity bits are thus particularly suitable for implementing the above described solution since such memories must in any case operate with very long strings of bits, without the possibility of modifying subsets of the internal word.

It is moreover evident that the proposed solution may also be extended to the part of the memory array that stores the parity bits for error correction or to the part destined for column redundancy.

When no correction of errors via parity bits is present and it is desired to maintain the possibility of modifying a datum part smaller than the length of the internal word, it is possible to operate in the way described below in the exemplifying case of a 256 bit internal word, of which just one byte is to be altered.

In this connection, reference is made to FIG. 4, which shows the structure of the memory array of FIG. 2, with division into bytes.

As may be noted, the memory cells C2 and C5 contain bits belonging to different bytes. In other words, modifying the contents of the byte B1 means intervening also on bytes B0 and B2.

FIG. 5 shows the eight levels storable in a generic memory cell Ci containing three bits, along with the respective threshold voltage distributions. The correspondence between the binary coding of each level and the threshold voltage values of the memory cell is completely arbitrary. In the considered example, the order is descending, and the lowest level (and the respective threshold voltage distribution) corresponds to the three bits with the highest values.

In practice, when the most significant bit MSB is at "1", we are operating on the four left hand distributions; when the most significant bit MSB is at "0", we are operating on the four right hand distributions.

When we wish to program the byte B0, there are no problems as regards the first six bits because they are entirely contained in the memory cells C0 and C1. To define the contents of the memory cell C2 it is, however, necessary to know also the value of the bit <8>; consequently, it is necessary to read the memory cell C2 before programming it.

When the byte B1 is to be programmed, it is necessary to evaluate whether the bit <8> remains unaltered or is to be modified. In the former case, the memory cell C2 must not be modified; in the latter case, it is necessary to modify the contents of the memory cell C2. However, it should be recalled that the only modification operation allowed on a nonvolatile memory is that of modifying a logic value "1" into a logic value "0". Therefore, if the bit <8> is changed, it means that it has changed from "1" to "0".

In the illustrated example, the bit <6> is the most significant bit of the memory cell C2, but the same reasoning applies even if the bit <8> is considered as the most significant bit.

At this point, it is necessary to make a distinction between two cases, according to the value of the bit <6>.

Case I—Initially, bit <6>="1" and bit <8>="1". The possible distributions are D0 and D2. The aim is to arrive at the following situation: bit <6>="1" and bit <8>="0". If the memory cell is in the distribution D0, it must migrate to D1; if the memory cell is in D2, it must migrate to D3. In both situations, the memory cell must be programmed.

Case II—Initially, bit <6>="0" and bit <8>="1". The possible distributions are D4 and D6. The aim is to arrive at the following situation: bit <6>="0" and bit <8>="0". If the memory cell is in the distribution D4, it must migrate to D5; if the memory cell is in D6, it must migrate to D7. Also in this case, the memory cell must be programmed.

In order to decide how to operate with the cell C5, we proceed to reading the cell and programming it, taking into account the desired value of bit <15> and the values of bits <16> and <17>.

In this way, the bytes B0 and B1 have been programmed independently. To program the byte B0 we must program three cells in parallel, whereas to program the byte B1 we must act on four cells.

During programming of the byte B2, as far as the memory cells C6 and C7 are concerned, there are no problems. Also in this case, however, the memory cell C5 involves two bytes. The most significant bit of the memory cell C5 is fixed by byte B1 which establishes whether it is necessary to operate on the four left hand distributions or on the four right hand distributions of FIG. 5, both with an already programmed byte B1 and with a still erased byte B1. In either case, the bits <16> and <17> may assume any combination by mere programming.

Also the byte B3 is in the conditions of the byte B0, and consequently the above explanation again applies.

The proposed solution hence includes dividing the binary word inside the device into 24 bit packets (corresponding to the number of bits per cell multiplied by the number of bits contained in a byte), managing them through an appropriate control logic which, at an hardware level, performs the above described procedure, as is also shown, for clarity, in the flowchart of FIG. 6.

In detail, initially (step 20) there is the query whether the byte B0, B1 or B2, is to be programmed.

If the answer is negative (output NO from step 20), the procedure terminates; otherwise (step 21), there is the query whether all three bytes are to programmed simultaneously.

If the answer is affirmative (output YES from step 21), programming in parallel of all 24 bits is performed on the basis of the data entered by the user (step 22), and the procedure terminates.

If the answer is negative (output NO from step 21), the bytes B0, B1, B2 are read (step 25). Next, the contents of the cells C2 and C5 are stored. In addition, service variables $\alpha$, $\beta$, $\gamma$, $\delta$, $\epsilon$, and $\zeta$ are respectively set equal to the values of bits <6>, <7>, <8>, <15>, <16>, and <17> (step 26).

Next, the query is whether the byte B1 is to be programmed (step 27). If the answer is affirmative (output YES), the query is posed whether also byte B0 is to be programmed (step 28). In the affirmative case (output YES from step 28), step 29 is carried out, and the cells C4–C0 are programmed on the basis of the data supplied by the user. The cell C5 is programmed according to the user data and to the values of the service variables $\epsilon$ and $\zeta$ previously stored, as described above. Then the procedure terminates.

In the negative case (output NO from step 28), the query is posed whether also the byte B2 is to be programmed (step 40). If the answer is affirmative (output YES), step 30 is carried out, and the cells C7–C3 are programmed on the basis of the data supplied by the user. The cell C2 is programmed according to the user data and to the values of the service variables α and β previously stored, as described above. Then the procedure terminates. In the negative case (output NO from step 40), step 41 is carried out, and the cells C3 and C4 are programmed on the basis of the data supplied by the user. The cells C2 and C5 are programmed according to the user data and to the values of the service variables α, β, ∈and ζ previously stored, as described above. Then the procedure terminates.

If the byte B1 is not to be programmed (output NO from step 27), there is the query whether the byte B0 is to be programmed (step 35). In the affirmative case (output YES), step 36 is carried out, and the cells C0 and C1 are programmed on the basis of the data supplied by the user. The cell C2 is programmed according to the user data and to the value of the service variable γ previously stored, as described above. At the end of step 36 and in the case of output NO from step 35, there is the query whether the byte B2 is to be programmed (step 37). If the answer is negative (output NO), the procedure terminates. If the answer is affirmative (output YES), step 38 is carried out, and the cells C6 and C7 are programmed on the basis of the data supplied by the user. The cell C5 is programmed according to the user data and to the value of the service variable δ previously stored, as described above. Then the procedure terminates.

The entire procedure described above must be carried out for each 24 bit packet into which the word is divided, where in general the bytes B0, B1 and B2 are replaced by the bytes B3$n$, B(3$n$+1) and B(3$n$+2), with n=0 ... (K/3−1), and where K is the number of bytes forming the internal word.

In fact, 24 bits correspond to an integer number of memory cells, and this enables the memory cells to be used up completely.

In the procedure of FIG. 6, programming in sequence enables a simpler description. As a matter of facts, the information may be modified for each byte and in a random way. In fact, before proceeding to any modification operation it is necessary to read the entire packet of 24 bits in order to have an exact knowledge of the contents of the memory cells that store bits belonging to two different bytes. Every alteration from "1" to "0" is made possible by the fact that, by reasoning on a 24 bit packet and using the numbering of the levels as shown in FIG. 5, it is merely necessary to program towards higher threshold levels.

In the case of a 256 bit internal word, there are ten 24 bit packets, and there are 16 bits remaining over, which can be stored using the truncation technique: the 16 bits are stored in six memory cells, and the 2 excess bits are eliminated. In this way, three memory cells are used for each byte, and one bit is eliminated in the last two bytes, so that they can be modified separately.

The architecture of the array implementing the truncation solution described above is the same as the one shown in FIG. 3. In the present case, however, the two excess bits cannot be discarded from the memory cell C85. In order to preserve the possibility of modifying the last two bytes separately, it is necessary to discard one bit from two different memory cells, for example from the memory cells C82 and C85. Programming of the first 240 bits occurs then in 24 bit packets and is managed by a logic that carries out the procedure of FIG. 6 ten times, either in parallel or sequentially.

The technique proposed for modifying a single byte may be used for modifying also longer binary words. When the aim is to intervene at the 16 bit word level, the procedure described above is repeated on a 16*3 bit packet. Basically, in order to modify a binary word of length y, in case of three bits per cell a programming algorithm which considers y*3 bits in parallel is required.

Similar considerations apply to column parity and column redundancy cells.

According to a different solution, the two excess bits associated to the 256 bit internal word may be used as additional storing space.

For example, NAND type flash memories normally comprise, besides the bits corresponding to the standard addressing space, an additional storing space that the customer can use for error correction with parity bits, for counters or for any other purpose that he might deem expedient. In general, 16 additional bytes are provided every 512 bytes, corresponding to the size of the page that is read in parallel.

In the case of 256 bits obtained with memory cells storing three bits each, it is easy to add 8 bits to the ordinary addressing space: two bits are obtained from truncation, and the other six bits can be implemented with two additional cells. The additional bits may be used in a manner transparent to the external user or may be left totally or partially to be managed by the user.

The advantages of the method according to the present invention are evident from the above.

Finally, it is clear that numerous variations and modifications may be made to the method described and illustrated herein, all falling within the scope of the invention as defined in the attached claims. In particular, it is emphasized that the method may be applied independently of the (non-binary) number of bits stored in each cell.

We claim:

1. A data managing method in a multilevel nonvolatile memory device having a memory array including a plurality of memory cells, the method comprising:
   storing in each of said memory cells a stored number of bits that is not an integer power of two; and
   storing a data byte in a non-integer number of the memory cells.

2. A data management method according to claim 1 wherein said stored number of bits is three.

3. A data managing method in a multilevel nonvolatile memory device having a memory array including a plurality of memory cells, the method comprising:
   storing in each of said memory cells a stored number of bits that is not an integer power of two; and
   storing in the memory array, during a first clock cycle, a data word comprising a plurality of bytes.

4. A data management method according to claim 3, comprising: reading, in a second clock cycle, said data word comprising said plurality of bytes.

5. A data management method according to claim 4, comprising: selecting one byte from among said plurality of bytes according to an external address.

6. A data management method according to claim 3, wherein said storing step comprises programming a preset number of adjacent memory cells.

7. A data management method according to claim 6, comprising: reading, in a second clock cycle, a number of bits equal to the product of said preset number of adjacent memory cells and said stored number of bits, and discarding excess bits.

8. A data management method according to claim 7, in which one byte comprises a preset number of bits, wherein said step of discarding comprises eliminating a number of bits equal to the difference between said number of read bits and a number of stored bits equal to the product of the number of bytes in said plurality of bytes and said preset number of bits.

9. A data management method according to claim 3, wherein said step of storing comprises simultaneously storing said data word and additional information; said additional information being at least partially stored in memory cells containing bits of said data word.

10. A data management method according to claim 9, wherein said step of storing said data word comprises storing a number of bits equal to the product of said stored number of bits and a number of bytes comprised in said plurality of bytes.

11. A data management method according to claim 9, wherein said step of storing additional information comprises storing a number of bits equal to the difference between a number of available bits and a number of word bits; said number of available bits being equal to the product of a preset number of the memory cells and said preset number of bits, and said number of word bits being equal to the product of the number of bytes in said plurality of bytes and said preset number of bits.

12. A data managing method in a multilevel nonvolatile memory device having a memory array including a plurality of memory cells, the method comprising:
storing in each of said memory cells a stored number of bits that is not an integer power of tow; in which a bytes comprises a preset number of bits, the storing step comprising storing in said memory cells a number of bits equal to a non-integer multiple of said preset number of bits.

13. A data management method according to claim 12, comprising:
reading a plurality of bits belonging to adjacent bytes;
storing some bits of said plurality of read bits;
acquiring a byte to be stored; and
programming a plurality of cells based on said byte to be stored and said some bits of said plurality of read bits.

14. A nonvolatile memory device comprising:
a memory array having a plurality of memory cells, wherein each of said memory cells stores a number of bits that is not an integer power of two, wherein said memory array comprises a preset number of adjacent memory cells storing a data word formed by a plurality of bytes;
a preset number of sense amplifiers equal to said preset number of adjacent memory cells, each of said sense amplifiers having an output;
a selector having a plurality of data inputs, a control input and output, said data inputs of said selector being each connected to a respective output of said sense amplifiers; and
a binary column decoder connected to said control input of said selector for connecting a selected data input among said data inputs to said output of said selector.

15. A device according to claim 14, wherein said number of bits is three.

16. A method for storing data in a nonvolatile memory, comprising:
storing in a first memory cell a bit of a first byte; and
storing in the first memory cell a first bit of a second byte while simultaneously storing in the first memory cell the first bit of the first byte.

17. The method of claim 16, further comprising:
storing in a second memory cell a second bit of the second byte; and
storing in the second memory cell a bit of a third byte while simultaneously storing in the second memory cell the second bit of the second byte.

18. The method according to claim 16, further comprising:
storing first and second portions of the first byte in the first memory cell and a second memory cell, respectively, the first portion including the bit of the first byte;
storing first and second portions of the second byte in the first memory cell and a third memory cell, respectively, the first portion of the second byte including the first bit of the second byte.

19. The method of claim 18 wherein if the second byte is to be programmed to a programming value and the first byte is not to be programmed, then the method comprises:
reading the first and second bytes;
storing the first portions of the first and second bytes in temporary storage locations;
programming the third memory cell according to the programming value; and
programming the first memory cell according to the programming value and the stored first portion of the first byte.

20. The method according to claim 18, further comprising storing first and second portions of a third byte in the third memory cell and a fourth memory cell, respectively, wherein if the second byte is to be programmed to a programming value and the first and third bytes are not to be programmed, then the method comprises:
reading the first, second, and third bytes;
storing the first portions of the first, second, and third bytes and the second portion of the second byte in temporary storage locations;
programming the third memory cell according to the programming value and the stored first portion of the third byte; and
programming the first memory cell according to the programming value and the stored first portion of the first byte.

21. The method according to claim 18 wherein if the first and second bytes are requested to be programmed to first and second programming values, the method includes programming the first, second and third memory cells in parallel.

* * * * *

UNITED STATES PATENT AND TRADEMARK OFFICE
CERTIFICATE OF CORRECTION

PATENT NO. : 6,646,913 B2  Page 1 of 1
DATED : November 11, 2003
INVENTOR(S) : Rino Micheloni et al.

It is certified that error appears in the above-identified patent and that said Letters Patent is hereby corrected as shown below:

<u>Column 9,</u>
Line 27, "power of tow; in which a bytes" should read as -- power of two; in which a byte --.
Line 51, "and output," should read as -- and an output, --.

Signed and Sealed this

Sixteenth Day of March, 2004

JON W. DUDAS
*Acting Director of the United States Patent and Trademark Office*